United States Patent [19]
Barton

[11] Patent Number: 5,846,319
[45] Date of Patent: Dec. 8, 1998

[54] METHOD AND APPARATUS FOR FORMATION OF HGCDTE INFRARED DETECTION LAYERS EMPLOYING ISOTHERMAL CRYSTAL GROWTH

[75] Inventor: Jeffrey Brian Barton, Goleta, Calif.

[73] Assignee: Amber Engineering, Inc., Goleta, Calif.

[21] Appl. No.: 614,628

[22] Filed: Mar. 13, 1996

[51] Int. Cl.$^6$ .................................................. C30B 19/06
[52] U.S. Cl. ................................ 117/60; 117/64; 117/65; 117/78; 117/907
[58] Field of Search ................................ 117/64, 65, 60, 117/907, 78

[56] References Cited

U.S. PATENT DOCUMENTS

| | | | |
|---|---|---|---|
| 4,315,477 | 2/1982 | Wang et al. | 118/64 |
| 4,401,487 | 8/1983 | Lockwood | 117/907 |
| 4,536,227 | 8/1985 | Brice et al. | 117/907 |
| 4,642,142 | 2/1987 | Harman | 117/907 |
| 4,898,834 | 2/1990 | Lockwood et al. . | |
| 4,917,757 | 4/1990 | Nishizawa | 117/907 |
| 5,259,900 | 11/1993 | Tregilgas et al. | 117/907 |
| 5,308,980 | 5/1994 | Barton . | |

OTHER PUBLICATIONS

Crystal Growth, by Brian R. Pamplin, Pergamon Press, pp. 470–471.
Liquid–Phase Epitaxy of $Hg_{1-x}Cd_xTe$ From Hg Solution: A Route To Infrared Detector Structures, by Tse Tung et al., Santa Barbara Research Center, Goleta, CA,.
Liquid Phase Growth of HgCdTe Epitaxial Layers, by C.C. Wang et al., J. Electrochem. Soc.: Solid–State Science And Technology, Jan. 1980,.
Experimental Determination of the Mercury–Rich Corner of the Hg–Cd–Te Phase Diagram, by Paul E. Herning, Journal of Electronic Materials, vol. 13, No. 1, 1984.
Slider LPE of $Hg_{1-x}Cd_xTe$ Using Mercury Pressure Controlled Growth Solutions, by T.C. Harman, Journal of Electronic Materials, vol. 10, No. 6, 1981, pp. 1069–1083.
State Of The Art Of Hg–Melt LPE HgCdTe At Santa Barbara Research Center, by T. Tung et al., Santa Barbara Research Center, Goleta, CA, (1686–08).

*Primary Examiner*—Robert Kunemund
*Attorney, Agent, or Firm*—Graham & James LLP

[57] ABSTRACT

A system and method for isothermally growing HgCdTe having improved material uniformity and run-to-run repeatability employs a growth solution vessel in which a substrate may be inserted. The growth solution is heated and maintained at a constant temperature while causing Hg to vaporize and rise within the growth solution vessel. A water-cooling jacket causes the Hg to condense and form on the walls of the growth solution vessel. The Hg condensate is directed into a calibrated reservoir. HgCdTe growth continues as the Hg is depleted from the growth solution and fills the reservoir. The reservoir is calibrated to hold the specific amount of Hg condensate corresponding to the desired layer of HgCdTe. The reservoir overflows when full and directs the overflow into the growth solution, causing HgCdTe formation to cease. The volume of the reservoir may be altered to capture more or less Hg condensate, as desired, in order to change the amount of HgCdTe formed on the CdTe substrate.

5 Claims, 7 Drawing Sheets

METHOD AND APPARATUS FOR FORMATION OF HGCDTE INFRARED DETECTION LAYERS EMPLOYING ISOTHERMAL CRYSTAL GROWTH

BACKGROUND OF THE INVENTION

1. Field of the Invention

The present invention relates to growth of crystals for infrared detection systems. More particularly, the present invention relates to growth of such crystals using liquid-phase epitaxy.

2. Description of Related Art

Infrared (IR) detection systems are of significant technological importance for a wide variety of civilian and military applications. One class of detection systems employs an infrared detector layer formed over a substrate to detect the IR radiation. In particular, HgCdTe epitaxial layers over a substrate, such as CdTe or CdZnTe, have desirable IR detection characteristics. As a result of continued growth in the use of infrared detectors, it is increasingly important to form highly reliable HgCdTe detectors, using a repeatable process, for a reduced fabrication cost.

Liquid-phase epitaxy (LPE) is currently the preferred method for formation of HgCdTe crystal layers on substrates for a large class of IR detection systems. LPE is a single-crystal growth process employing precipitation of a material from a cooling solution onto a substrate. In particular, LPE has emerged as the predominant crystal growth technology for the fabrication of HgCdTe IR detectors for high-performance photoconductive (PC), photovoltaic (PV), and laser detector devices in the 2-to-18 $\mu$m spectral region. This is mainly due to the fact that LPE is a very simple technique which allows growth of high-quality epitaxial crystal layers on several different substrates.

Specifically, high quality HgCdTe epitaxial layers have been grown on CdTe substrates by LPE. CdTe is commonly used for the substrate because its lattice mismatch with epitaxial $Hg_{1-x}Cd_xTe$ is less than 0.3%. CdZnTe is also commonly used where the addition of a small quantity of Zn to the CdTe results in elimination of lattice mismatch with epitaxial $Hg_{1-x}Cd_xTe$. Two major LPE techniques have been followed in fabricating HgCdTe: a vertical open-tube LPE approach involving either Hg-rich or Te-rich solutions; and variations of horizontal LPE primarily using Te-rich solutions. These LPE techniques have been extensively developed in the IR industry.

Early attempts at LPE growths of HgCdTe from Hg-rich solutions used closed-tube systems to contain the high vapor pressure of Hg. The small-size of the growth solutions used, however, made it very difficult to grow epitaxial layers of uniform composition due to the problem of Cd depletion during growth.

With reference to FIG. 1, a conventional VLPE approach to growing HgCdTe using a Hg-rich solution will be described. The illustrated approach to fabricating HgCdTe using a Hg-rich solution uses a VLPE technique which employs a large Hg-rich growth solution 18. This so-called "infinite growth solution" provides the needed Cd throughout the growth process thereby avoiding excessive Cd depletion. In addition, the use of a large growth solution results in improved compositional uniformity of layers from run-to-run, since the amount of material removed during each growth cycle is relatively insignificant.

Prior to growth, an appropriate amount of high purity Cd and Te are added to the Hg growth solution 18 (the specific amounts of Cd and Te added depend upon the composition (x-value) of $Hg_{(1-x)}Cd_xTe$ to be grown). The relationship between growth solution composition and $Hg_{(1-x)}Cd_xTe$ composition growth is known in the art and can be described by the $Hg_{1-x}Cd_xTe$ phase diagram. The large growth solution is maintained in an unsaturated state above the appropriate growth temperature between successive runs. During each run the CdTe or CdZnTe substrate is lowered into the growth solution and the temperature of the growth solution and substrate is reduced to the saturation temperature, typically in the range of 500° C., in order to form an epitaxial layer of HgCdTe on the CdTe or CdZnTe substrate.

More specifically, beginning from the saturation temperature, the growth solution temperature is reduced at a rate from 0.05° C. to 1° C./min. with a typical value on the order of a rate of 0.10° C./min. At this rate, VLPE growth takes approximately 50 minutes, to establish an approximately 25 $\mu$m epitaxial layer on the CdTe or CdZnTe substrate. This corresponds to a growth rate of approximately 5 $\mu$m/° C.

This "infinite growth solution" VLPE approach has several advantages in that it permits a relatively low liquidus temperature and easily permits incorporation of temperature-stable impurity dopants such as As, Sb, and In in the HgCdTe layers during growth. Furthermore, the use of the infinite growth solution provides improved uniformity and reproducibility of composition and thickness, since the amount of material removed from the growth solution during each growth run is relatively insignificant. Large volume growth solutions additionally allow doping impurities to be accurately weighed for incorporation into growing layers.

One significant disadvantage of the prior art VLPE growth system of FIG. 1, however, is the difficulty in achieving material uniformity in the plane of the LPE layer and in achieving repeatable material composition (x-value). The HgCdTe forms as the temperature is reduced, and is dependent upon the ratio of Hg, Cd and Te in the growth solution as HgCdTe formation proceeds. For a given growth solution, the composition or x-value of $Hg_{(1-x)}Cd_xTe$ grown depends upon the temperature at which the crystal is formed. For conventional growth in which the temperature is being ramped downward to cause crystal growth there is unavoidable material non-uniformity. Since the growth solution is cooled from its walls and the surface, it is obvious that the temperature is not constant within the solution where the actual crystal growth occurs. It therefore follows that the material x-value which is grown will be non-uniform across the plane of the LPE layer. Furthermore, the final x-value or surface x-value determines the longest infrared wavelength to which the material will respond. This depends on the temperature at which growth is terminated. In conventional growth, surface x-value is controlled by terminating growth at a specific temperature in a system in which the temperature is continually dropping. This method is subject to error and consequent surface x-value non-uniformity from run-to-run. In conventional VLPE growth, extremely careful monitoring of the growth solution is necessary to reduce these effects. This in turn increases the cost of the process due to necessary manpower and/or monitoring equipment.

Another concern of the prior art growing technique is its inefficiency. During conventional growth by cooling the growth solution, the growth efficiency is typically 5%–10%. This is because the solution cools from the surface and the walls of the growth solution vessel and there is consequently significant growth upon the walls and surface.

Accordingly, conventional HgCdTe growth systems reliant on reducing the temperature of the growth solution in order to produce HgCdTe may be unsuitable in applications requiring efficient, repeatable production of HgCdTe detector layers demanding accurate wavelength control. Accordingly, a need presently exists to provide HgCdTe detector layers having improved material uniformity in a manner which is practical for such desired applications.

SUMMARY OF THE INVENTION

The present invention provides a solution to the above-noted problems of the conventional HgCdTe crystal growth systems and methods. In particular, the present invention provides an improved HgCdTe growth method and apparatus which provides HgCdTe epitaxial layers having improved material uniformity and run-to-run repeatability. The present invention further provides such HgCdTe crystal growth with less monitoring than conventional systems and hence reduced costs.

In accordance with a preferred embodiment, a method is provided for growing HgCdTe isothermally, comprising the steps of heating a HgCdTe growth solution contained within a closed solution vessel to a temperature suitable for forming HgCdTe on a CdTe or CdZnTe substrate immersed in the growth solution. At- this temperature a portion of the Hg vaporizes and rises from the growth solution. As the Hg transfers from the growth solution the concentration of Hg within the HgCdTe solution is altered, causing HgCdTe to form on the CdTe or CdZnTe while maintaining a substantially constant temperature.

As the Hg vapor rises within the growth solution vessel it is cooled, e.g. by a water-cooling jacket surrounding the vessel. The cooled Hg vapor condenses on the inner wall of the growth solution vessel proximate the cooling zone. The resulting condensate Hg, which is influenced by gravity to stream back to the bottom of the growth solution vessel to rejoin the growth solution, is captured and directed into a reservoir. The HgCdTe layer is formed as the condensate Hg is collected. When the reservoir is full, the condensate Hg overflows the reservoir and continues its progress towards the bottom of the growth solution vessel until it rejoins the growth solution, stopping the formation of the HgCdTe layer.

In accordance with a preferred embodiment of the present invention, the crystal growth apparatus includes a closed growth solution vessel. A furnace proximate the base of the growth solution vessel is provided for heating the HgCdTe growth solution within the growth solution vessel and for maintaining the HgCdTe growth solution at a substantially constant temperature. The growth solution vessel is provided with a water-cooling jacket proximate the top of the growth solution vessel for cooling the Hg vapor formed within the growth solution vessel. Once condensed, the Hg condensate streams down the sides of the growth solution vessel to return to the growth solution.

The present invention provides the growth solution vessel with a system of channels and a reservoir for capturing the Hg condensate. The channel is provided between the furnace and the water-cooling jacket. The channel intercepts the Hg condensate as it streams towards the bottom of the vessel and directs it into a calibrated reservoir. The reservoir is secured to the side of the growth solution vessel and is calibrated to hold a specified volume of Hg condensate. Once the reservoir is filled, the excess condensate Hg flows into the growth solution and causes HgCdTe growth to cease.

The volume of the reservoir may be altered by replacing the reservoir casing with a reservoir casing having a different volume. The reservoir casing having a different volume may capture more or less Hg condensate, as desired, in order to change the amount of HgCdTe formed on the CdTe substrate. In an alternate embodiment, the reservoir casing may be fixedly secured on the growth vessel wall such that it may not be replaced, but its effective volume altered by the addition or removal of an inert (e.g. quartz) "filler volume".

In an alternate embodiment, the reservoir of the present invention may include a means for returning all or a portion of the condensate into the growth solution. The means for returning may be provided as a valve with an actuator which, when actuated, empties the contents of the reservoir back into the growth solution.

In an alternate embodiment, the reservoir of the present invention may include a means for tuning the volume of the reservoir. The tuning means adjusts the volume of the reservoir and may be provided as a tuning head comprised of an inert material and a tuning actuator. By actuating the tuning actuator to drive the tuning head into the reservoir, the volume of the reservoir is reduced by the portion of the volume of the tuning head below the lip of the reservoir.

The present invention thus provides a method for growing HgCdTe in a manner which is readily compatible with existing manufacturing techniques but eliminates the need to methodically lower temperature to promote crystal growth once crystal growth has begun.

Accordingly, it will be appreciated that the present invention provides an improved crystal growing apparatus and method providing improved HgCdTe material uniformity and run-to-run repeatability. It will be further appreciated that the present invention provides improved growth efficiency and repeatability with a simplified growth apparatus. With isothermal growth, evaporation occurs from the surface only so there are fewer competing growth surfaces and therefore greater efficiency may be achieved. It will be further appreciated that the present invention provides such improvements while reducing monitoring of the process thereby reducing processing costs.

A more complete understanding of the improved HgCdTe growing apparatus and method will be afforded to those of ordinary skill in the art, as well as a realization of additional advantages and objects thereof, by a consideration of the following detailed description of the preferred embodiment. Reference will be made to the appended sheets of drawings which will first be described briefly.

DETAILED DESCRIPTION

Figure 1:
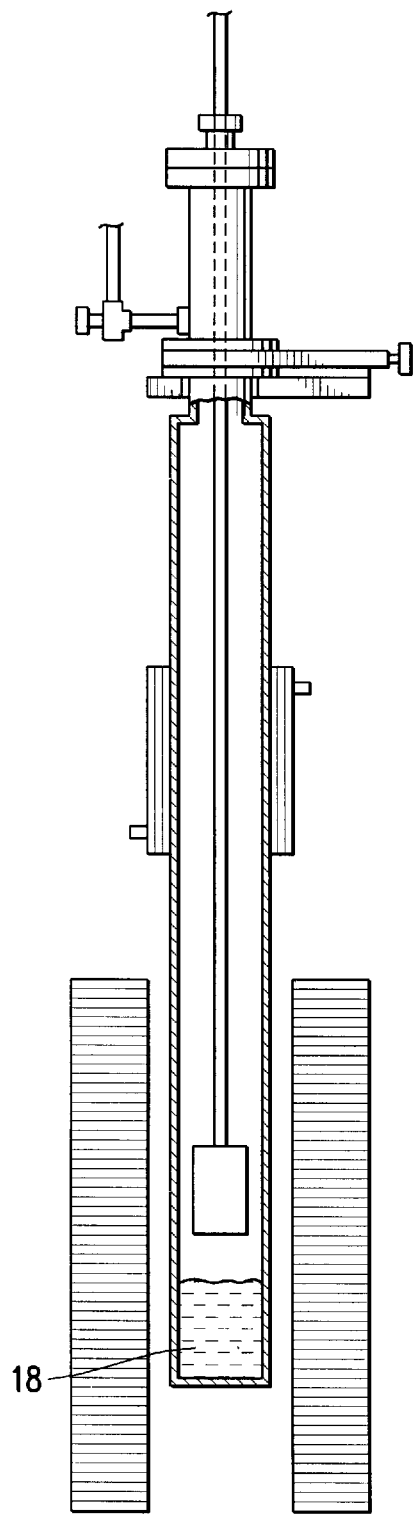
FIG. 1 is a cross-sectional view of a prior art crystal growing system.

A detailed description of the present invention will now be presented in conjunction with the embodiment of the present invention illustrated in FIGS. 2–15, wherein like reference numbers refer to like elements. It is to be understood that the present invention is in no way limited to the embodiment shown in the drawings.

In accordance with a preferred embodiment of the present invention, a method is provided for growing HgCdTe epitaxial crystal layers on a substrate isothermally. A HgCdTe growth solution contained within a solution vessel is heated to a temperature suitable for forming HgCdTe on a substrate. The substrate may be formed from any suitable material having beneficial substrate qualities for forming HgCdTe such as -CdTe, CdZnTe, CdTe on Si, CdZnTe on Si, CdTe on Sapphire, and CdZnTe on Sapphire. The substrate is then immersed in the growth solution. At this temperature a portion of the Hg vaporizes and rises from the growth solution. As the Hg transfers from the growth solution the concentration of Hg within the HgCdTe growth solution is altered, causing HgCdTe to form on the CdTe or CdZnTe substrate while the growth solution is maintained at a substantially constant temperature.

As the Hg vapor rises within growth solution vessel it is cooled in a cooling zone and condenses on the inner wall of the growth solution vessel. The condensate Hg is captured and directed into a reservoir. The HgCdTe layer is formed as the condensate Hg is collected. When the reservoir is full, the condensate Hg overflows the reservoir and continues its progress towards the bottom of the growth solution vessel until it rejoins the growth solution, thus stopping the formation of the HgCdTe layer.

Figure 2:
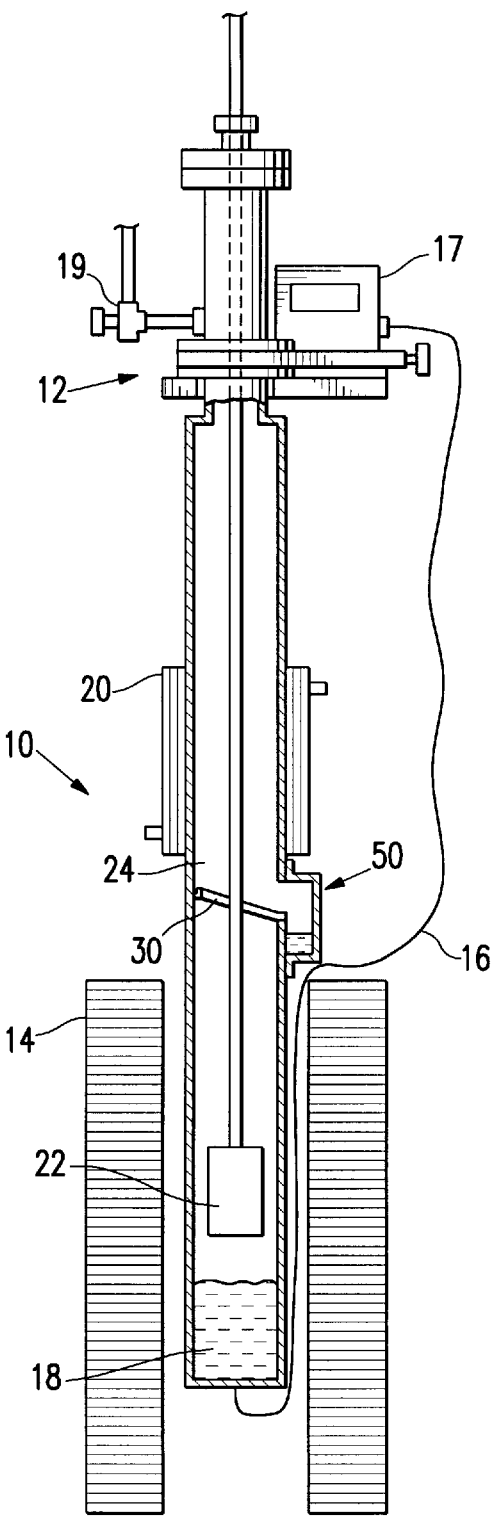
FIG. 2 is a cross-sectional view of an improved crystal growing system in accordance with the present invention.

A crystal growing system in accordance with the present invention is shown in FIG. 2. The system includes a growth solution vessel 10 and an airlock assembly 12. The airlock 12 is provided to provide controlled access to the growth solution vessel 10 which, together form a closed system during crystal growth. Venting the airlock may be readily controlled by a valve 19.

The growth solution vessel 10 includes a furnace 14 which allows accurate control of the growth solution vessel's thermal characteristics and a thermocouple 16 to monitor the Hg-rich growth solution 18 temperature. The furnace 14 may be maintained at the desired temperature by supplying the thermocouple temperature information to a furnace control microprocessor 17. A water-cooling jacket 20 is provided to cool the vapor generated by the Hg-rich growth solution.

In a preferred embodiment, the substrate may be composed of cadmium-telluride (CdTe). The CdTe substrates are loaded into a graphite LPE paddle 22 to be lowered into the growth solution vessel 10 through the airlock assembly 12. The airlock assembly allows access to the growth solution 18 without the need to cycle the system to ambient temperature. In addition the airlock assembly 12 provides access to the closed growth solution vessel 10. The graphite LPE paddle 22 may include shutters to protect the CdTe substrate from Hg vapor etching before the substrate is inserted into the Hg-rich growth solution 18. As is known in the art, the graphite LPE paddle 22 is attached to an actuator rod 24 which is used to raise and lower the graphite LPE paddle 22 into and out of the Hg-rich growth solution 18.

The present invention takes advantage of the extremely high vapor pressure of Hg which exists in a closed Hg-rich HgCdTe growth environment. Typically there is a significant condensation of Hg in the upper cool zone of the growth solution vessel which runs down the growth solution vessel wall and back into the growth solution. If this liquid Hg is captured instead of being allowed to return to the growth solution, the solute concentration of the growth solution increases and the solution composition changes such that HgCdTe material will be grown according to the amount of Hg captured.

As seen in FIG. 2, the crystal growing system of the present invention includes a channel 30 and a Hg reservoir 50 having a carefully controlled volume. As shown in detail in FIG. 3, the channel 30 is secured to the inner surface 32 of the growth solution vessel wall 34 to provide a seal between the channel 30 and the growth solution vessel wall inner surface 32. In addition, the channel 30 is secured to the inner surface 32 of the growth solution vessel wall 34 at an angle such that any condensate captured in the channel is encouraged to flow towards reservoir 50. The channel may be formed from a material substantially similar to the material used in the formation of the inner surface 32 of the growth solution vessel wall 34 and secured by a process as known in the art.

Hg vapor 42 exists everywhere within the growth solution vessel as a result of the high vapor pressure generated at the elevated temperature of the growth solution. The Hg vapor is cooled by the dramatically lowered temperature provided by the water-cooling jacket located above the channel 30. The cooled Hg vapor 42 condenses as condensate Hg 40 on the growth solution vessel inner surface 32 and is caused by gravity to stream down the growth solution vessel wall to return to the growth solution. The channel 30, however, intercepts the liquid Hg before it can return to the growth solution at the base of the growth solution vessel 10.

Figure 3:
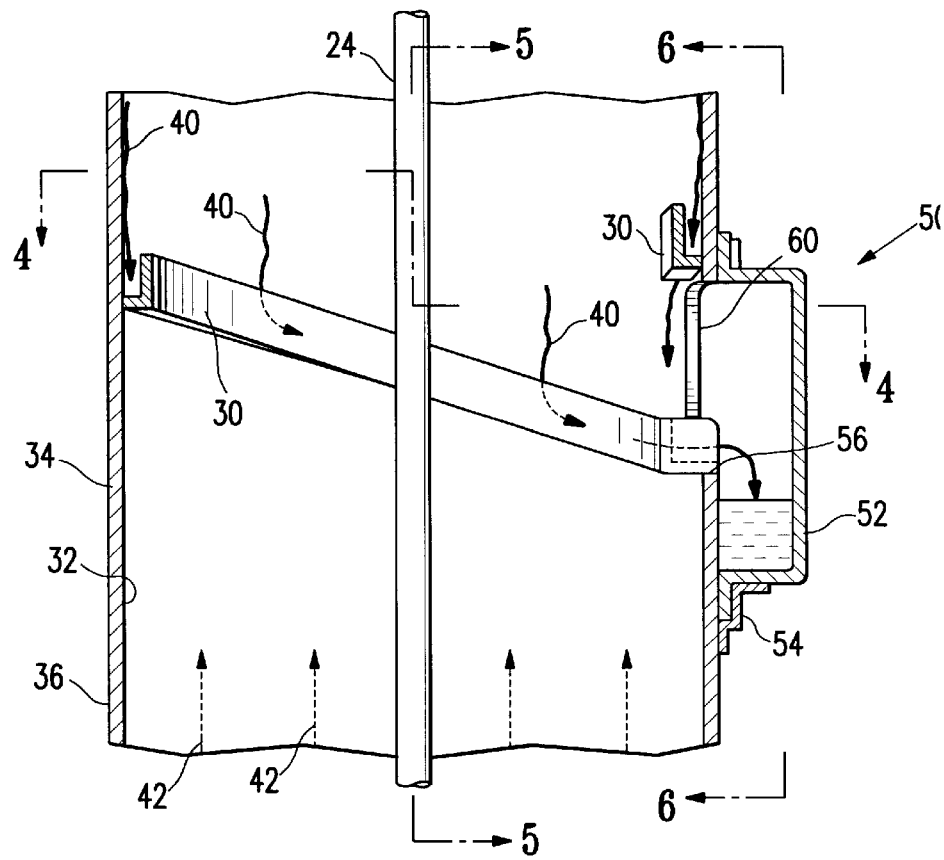
FIG. 3 is a first side cross-sectional view of the growth solution vessel of an improved crystal growing system in accordance with the present invention.

FIG. 3 also shows the reservoir 50 including the reservoir casing 52 and the reservoir bracket 54. The reservoir casing 52 and the reservoir bracket 54 may be formed of materials which are substantially similar to the material used in the formation of the channel 30. The reservoir bracket 54 may be secured to the growth solution vessel wall outer surface 36 in substantially the same manner as the channel 30 is secured to the growth solution vessel wall inner surface 32 to form a vapor-proof, temperature resistant seal. As described further below, the reservoir casing 52 is inserted into the reservoir bracket 54 to form a reservoir 50 between the reservoir casing 52 and growth solution vessel outer wall 34.

Figure 4:
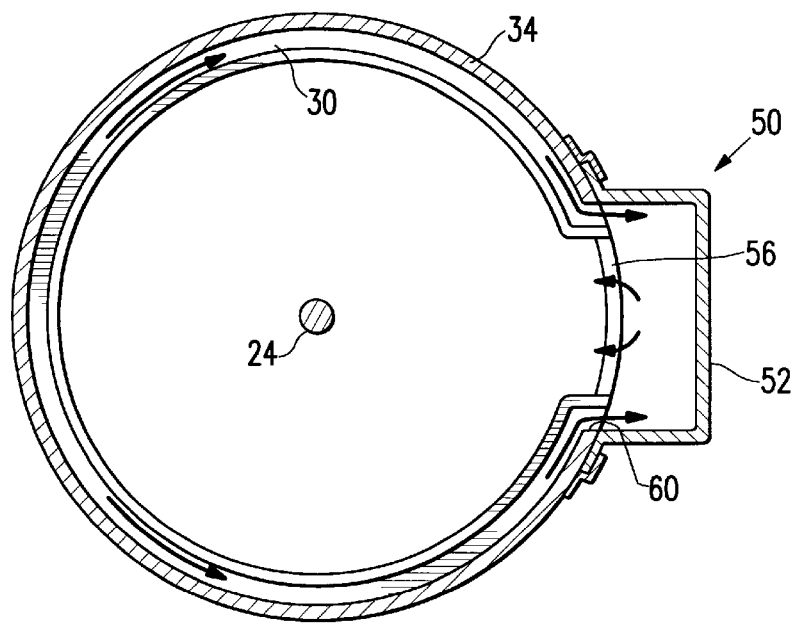
FIG. 4 is a top cross-sectional view of the growth solution vessel of an improved crystal growing system taken along the line 4—4 from FIG. 3.

FIG. 4 is a top cross-sectional view of the growth solution vessel taken along the line 4—4 from FIG. 3 and shows the progress of the condensate Hg 40. As shown in FIG. 4, fluid communication is provided between channel 30 and reservoir 50 via opening 60 in the growth solution vessel wall 34. The opening 60 permits Hg condensate 40 to flow from the channel 30 to the reservoir 50 as well as from the reservoir 50 to the growth solution vessel 10. Also, as shown is FIG. 3 and 4, the channel 30 is provided with a portion secured above opening 60 to ensure all Hg condensate is captured in reservoir 50.

Figure 5:
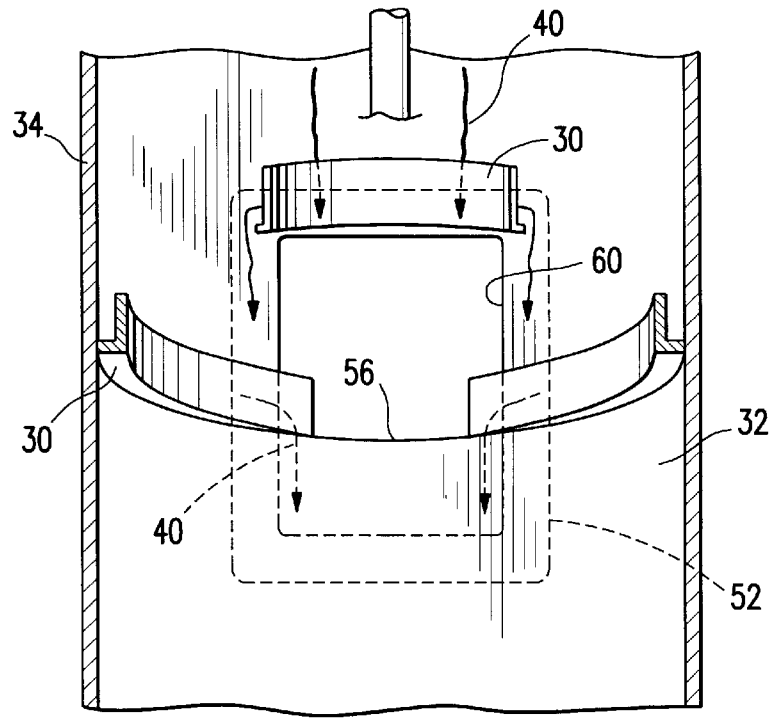
FIG. 5 is a second side cross-sectional view of the growth solution vessel of an improved HgCdTe growing system taken along the line 5—5 from FIG. 3.

FIG. 5 is a second side cross-sectional view of the growth solution vessel taken along the line 5—5 from FIG. 3. The channel 30 proceeds along the growth solution vessel wall inner surface 32 in a downward slope towards the reservoir 50. The respective ends of the channel 30 meet the growth solution vessel wall opening 60 at the lower edge 56 of the growth solution vessel wall opening. As shown in FIG. 5, the reservoir casing 52 is secured around growth solution vessel wall opening 60.

Figure 6:
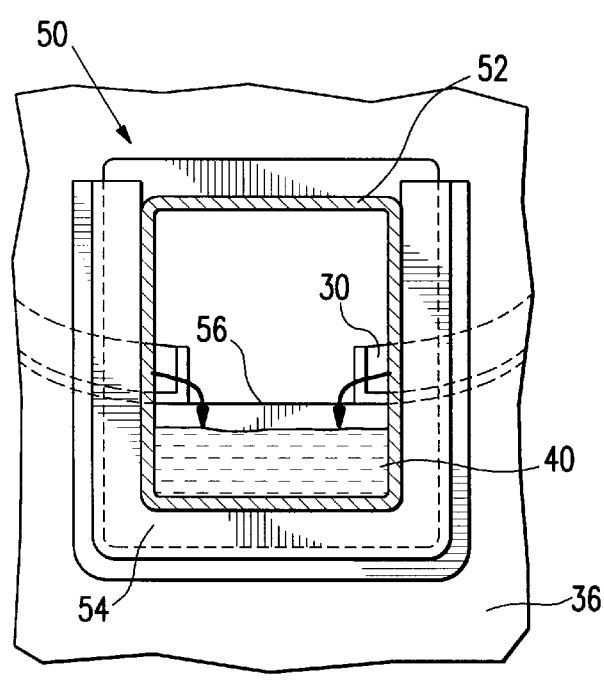
FIG. 6 is a second side cross-sectional view of the growth solution vessel of an improved crystal growing system taken along the line 6—6 from FIG. 3 showing the flow of Hg into the reservoir.

FIG. 6 is a second side cross-sectional view of the growth solution vessel taken along the line 6—6 from FIG. 3. In this embodiment, the reservoir casing 52 is secured along three sides by reservoir bracket 54. This permits the reservoir casing 52 to be removed and replaced with a reservoir casing 52 of a different volume. As is discussed below, changing the volume of the reservoir 50 alters the production of HgCdTe in the growth solution. Therefore, the generation of HgCdTe may be modified simply by changing the size of the reservoir casing. In an alternate embodiment, the casing may be permanently secured to the growth solution vessel outer surface using a substantially similar process as used to secure the channel 30 to the growth solution vessel wall inner surface 32. This obviates the need of the reservoir bracket in the alternate embodiment.

Figure 7:
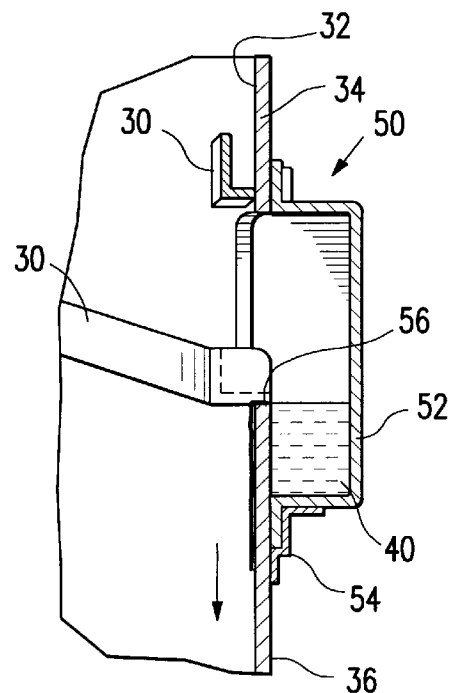
FIG. 7 is a partial first side cross-sectional view of the growth solution vessel of an improved crystal growing system showing a cross-section of the reservoir and the flow of Hg out of the reservoir.

As shown in FIG. 6, the Hg condensate 40 flows from the channel 30 into the reservoir 50. As shown in FIG. 7, as the rising level of Hg reaches the lower edge 56 of the opening in the growth solution vessel wall Hg condensate 40 flows over the lower edge 56 to return to the growth solution. As better shown in FIG. 7, once the liquid Hg has filled the area defined between the growth solution vessel wall outer surface 36 and the reservoir casing 52 up to lower edge 56 of the opening in the growth solution vessel wall, the liquid Hg streams down the growth solution vessel wall inner surface 32 to return to the growth solution. The volume provided by the reservoir casing 52 is carefully measured, thus the reservoir 50 overflows just as it is desired to conclude the growth of HgCdTe on the CdTE substrate. As the reservoir 50 overflows, the liquid Hg flows from the reservoir 50 and may return to the growth solution 18 at which point the amount of Hg in the growth solution becomes relatively constant and growth of HgCdTe ceases. The HgCdTe material grown is tuned in wavelength and thickness by controlling the volume of liquid Hg which is captured in the reservoir 50 and by the growth solution composition and growth temperature. The temperature of the growth solution is held constant during the growth process.

Figure 8:
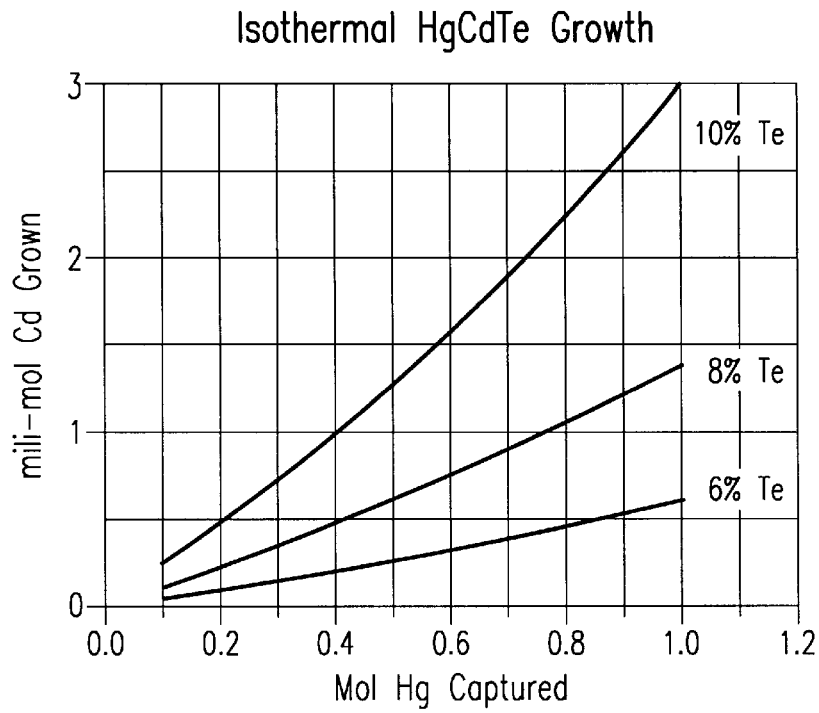
FIG. 8 is a graph illustrating, for three different concentrations of Te, the relationship between the moles of Hg captured and the milli-moles of Cd grown.

FIG. 8 is a graph illustrating, for three different concentrations of Te, the amount of Cd which is grown from a growth solution of 15.7 mol Hg as a function of the amount of Hg condensate 40 which is captured by reservoir 50. The example of FIG. 8 is for the case that the last material to be grown is of composition x=0.222 which is nominal for 10.5$\mu$ cutoff applications. A typical LWIR HgCdTe layer (10 cm$^2$×20 $\mu$m thick) contains about 1×10 mol of Cd. Examination of FIG. 8 indicates that this amount of material may be grown isothermally by the present invention for a variety of concentrations of Te. In addition, with isothermal growth, evaporation occurs only from the surface of the growth solution so by comparison with conventional growth by reducing the growth solution temperature, there are far fewer competing growth surfaces and therefore greater growth efficiency may be achieved.

Figure 9:
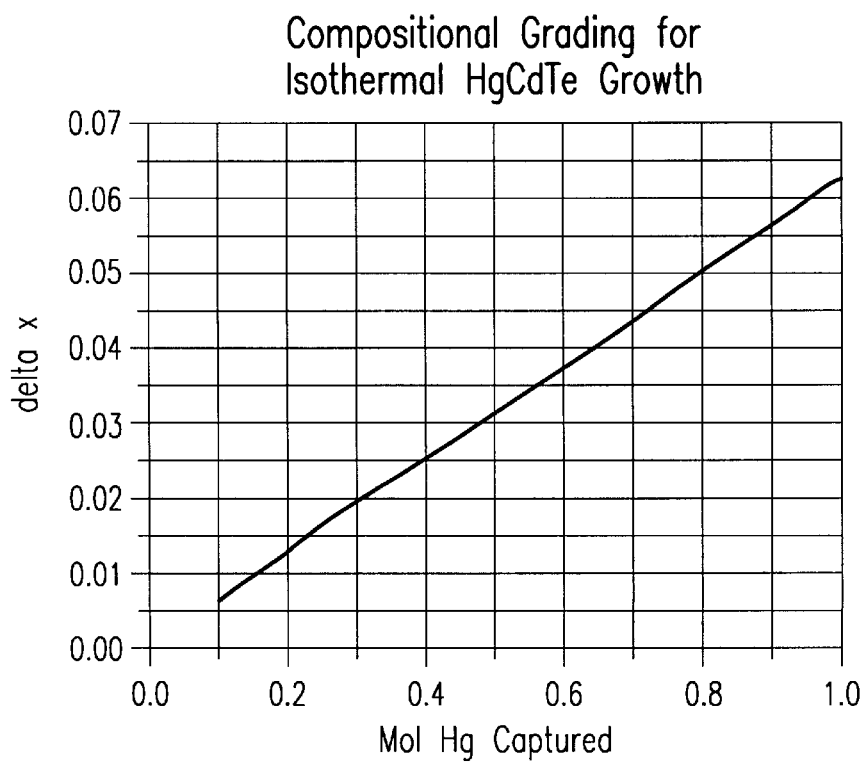
FIG. 9 is a graph illustrating the compositional gradient as a function of the amount of Hg captured.

FIG. 9 shows the calculated variation in x-value ($Hg_{(1-x)}Cd_xTe$) as a function of the amount of Hg condensate 40 captured in reservoir 50. The variation in x-value is the difference in x-value between the first material grown at the substrate interface and the last material grown on the LPE layer surface. As shown, as the amount of Hg captured increases, the x-value gradient increases. As a benchmark, conventional LPE growth from cooling the growth solution yields delta-x values of about 0.02. The grading realized with isothermal growth may be greater or less than 0.02 depending upon the growth efficiency obtained. It is however anticipated that the grading realized with isothermal growth will be less than that realized with conventional growth due to the greater growth efficiency which is expected.

Figure 10:
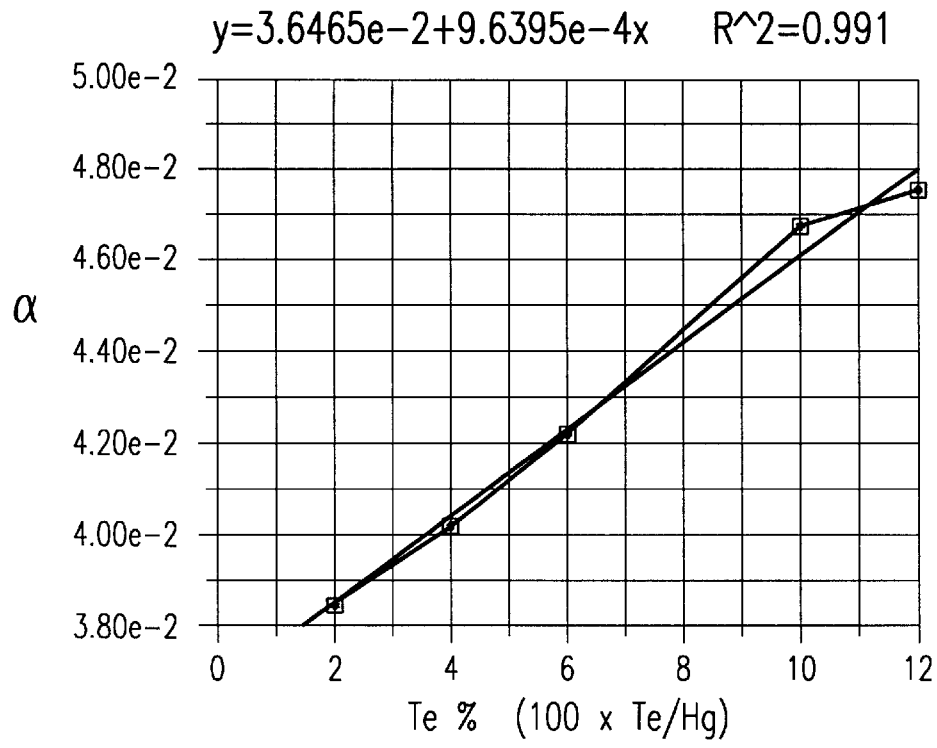
FIG. 10 is a graph illustrating the relationship between a, used in calculating the concentration of Cd, and the percentage of Te in a HgTe solvent.
Figure 11:
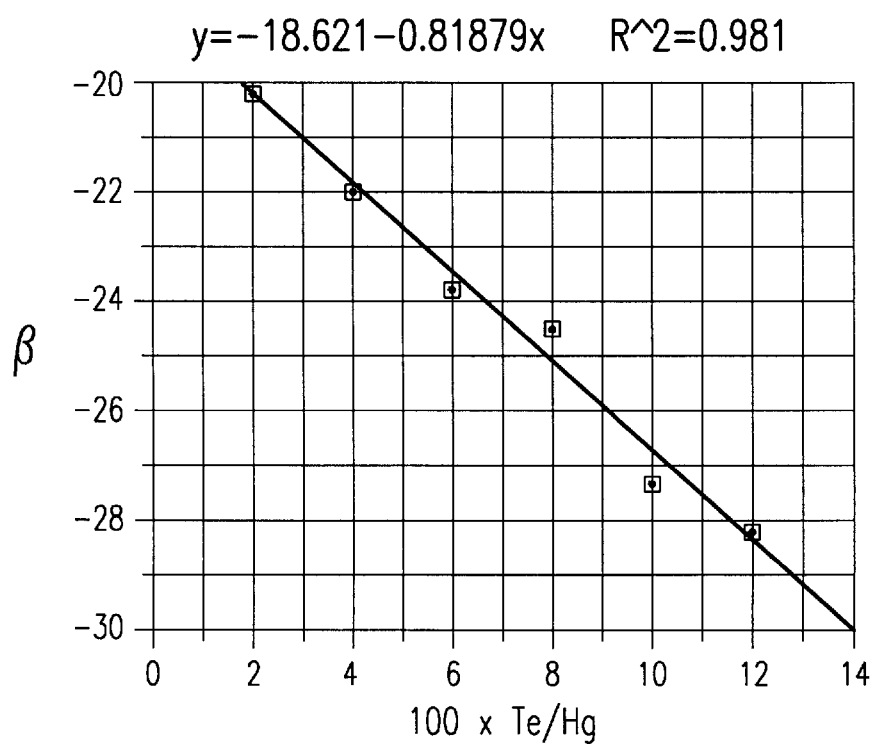
FIG. 11 is a graph illustrating the relationship between β, used in calculating the concentration of Cd, and the percentage of Te in a HgTe solvent.

Referring to FIGS. 10 and 11, and assuming Cd to be the solute in a Hg-Te solvent, the concentration of Cd in a saturated solution is given by the equation:

$$Cd = \exp\{\alpha T + \beta\} \text{ mol \% } Cd$$

where $\alpha$ and $\beta$ are functions of the molar ratio $N_{Te}/N_{Hg}$, where $N_{Te}$=number of moles of Te in solution and where $N_{Hg}$=number of moles of Hg in solution. FIGS. 10 and 11 show how $\alpha$ and $\beta$ vary as a function of the ratio of $N_{Te}/N_{Hg}$ in the growth solution. As shown in FIG. 10, $\alpha$ increases as the ratio of $N_{Te}/N_{Hg}$ increases according to the equation:

$$\alpha = 3.65 \times 10^{-2} + 9.64 \times 10^{-4} \left[ 100 \frac{N_{Te}}{N_{Hg}} \right]$$

Conversely, as shown in FIG. 11, $\beta$ decreases as the ratio of $N_{Te}/N_{Hg}$ increases according to the equation:

$$\beta = -18.6 - 0.819 \left[ 100 \frac{N_{Te}}{N_{Hg}} \right]$$

Therefore, the concentration of Cd in a saturated solution with Hg and Te as the solvent may be derived using the above equation in combination with the data in FIGS. 10 and 11.

The following equation may be used to calculate the quantity of Cd grown from solution as a function of the amount of condensate (Hg) captured in this isothermal process.

The amount of Cd grown from solution $C_g$.

$$C_g = \frac{C_i N_i}{100} - \frac{C_f N_f}{100}$$

where $C_{i,f} \to$ Cd concentration [mol %]
$N_{i,f} \to$ moles of solvent
i, f $\to$ initial and final states $$C_g = \frac{1}{100} \{N_i \exp(\alpha_i T + \beta_i) - [N_i - S]\exp(\alpha_f T + \beta_f)\}$$

$$\alpha_i = 3.65 + 10^{-2} + \left(\frac{N_{Te}}{N_{Hg}}\right) \times 100 \times 9.64 \times 10^{-4} \, [°C.^{-1}]$$

$$\alpha_f = 3.65 + 10^{-2} + \frac{N_{Te}}{N_{Hg} - S} \times 100 \times 9.64 \times 10^{-4} \, [°C.^{-1}]$$

where $N_{Te}$=moles of Te in growth solution
$N_{Hg}$=moles of Hg in growth solution initially
S=moles Hg captured $$\beta_i = -18.62 - 0.819 \frac{N_{Te}}{N_{Hg}} \times 100$$

$$\beta_f = -18.62 - 0.819 \frac{N_{Te}}{N_{Hg} - S} \times 100$$

and $N_i = N_{Te} + N_{Hg}$
$N_f = N_i - S$

To complete the analysis and in order to make meaningful comparisons, it is also necessary to know the x-value ($Hg_{(1-x)}Cd_xTe$) of the material grown. The x-value as a function of temperature and solvent composition $N_{Te}/N_{Hg}$ can be expressed functionally by fitting phase diagram data to a quadratic equation in T and x. It is thereby possible to express $x(T,(N_{Te}/N_{Hg}))$ in the form of the quadratic equation:

$$x(T,N_{Te}/N_{Hg}) = \frac{-b \pm \sqrt{b^2 - 4ac}}{2a}$$

where a=-0.44 b=-0.84

$$c = -6.18 + 2.63T - 0.183T^2 - \ln\left(100 \frac{N_{Te}}{N_{Hg}}\right)$$

T=T(° C.)/100

Using the above equations, it is possible to calculate both the quantity of material grown from solution as well as the composition of the material grown. The following table compares the amount of material grown from solution as a function of the quantity of Hg captured for 2%–10%=($N_{Te}/N_{Hg}$)×100 using an isothermal process. All calculations are for the case that the last material to be grown is of composition x=0.222 which is nominal for 10.5µ cutoff applications. $N_{Hg}$=15.7 mol.

| $\left[100 \frac{N_{Te}}{N_{Hg}}\right]$ $Te_i$ | $\left[100\left(\frac{N_{Te}}{N_{Hg}-S}\right)\right]$ $Te_f$ | $x_i$ | $x_f$ | T | $S_{(mol)}$ | Cd grown millimole |
|---|---|---|---|---|---|---|
| 2% | 2.01 | .228 | .222 | 359.4 | 0.1 | 3.10 × 10⁻³ |
|  | 2.03 | .234 | .222 | 359.8 | 0.2 | 6.31 × 10⁻³ |
|  | 2.04 | .241 | .222 | 360.3 | 0.3 | 9.63 × 10⁻³ |
|  | 2.05 | .247 | .222 | 360.8 | 0.4 | 1.31 × 10⁻² |
|  | 2.07 | .253 | .222 | 361.3 | 0.5 | 1.66 × 10⁻² |
|  | 2.08 | .259 | .222 | 361.8 | 0.6 | 2.03 × 10⁻² |
|  | 2.09 | .265 | .222 | 362.4 | 0.7 | 2.41 × 10⁻² |
|  | 2.11 | .272 | .222 | 362.9 | 0.8 | 2.80 × 10⁻² |
|  | 2.12 | .278 | .222 | 363.4 | 0.9 | 3.21 × 10⁻² |
|  | 2.14 | .284 | .222 | 363.9 | 1.0 | 3.63 × 10⁻² |
| 4% | 4.03 | .228 | .222 | 416.6 | 0.1 | 1.69 × 10⁻² |
|  | 4.05 | .234 | .222 | 417.2 | 0.2 | 3.45 × 10⁻² |
|  | 4.08 | .241 | .222 | 417.8 | 0.3 | 5.28 × 10⁻² |
|  | 4.10 | .247 | .222 | 418.4 | 0.4 | 7.18 × 10⁻² |
|  | 4.13 | .253 | .222 | 419.0 | 0.5 | 9.16 × 10⁻² |
|  | 4.16 | .259 | .222 | 419.6 | 0.6 | 1.12 × 10⁻¹ |
|  | 4.19 | .265 | .222 | 420.2 | 0.7 | 1.34 × 10⁻¹ |
|  | 4.21 | .272 | .222 | 420.8 | 0.8 | 1.56 × 10⁻¹ |
|  | 4.24 | .278 | .222 | 421.5 | 0.9 | 1.79 × 10⁻¹ |
|  | 4.27 | .284 | .222 | 422.1 | 1.0 | 2.03 × 10⁻¹ |
| 6% | 6.04 | .228 | .222 | 455.9 | 0.1 | 4.8 × 10⁻² |
|  | 6.08 | .234 | .222 | 456.6 | 0.2 | 9.8 × 10⁻² |
|  | 6.12 | .241 | .222 | 457.2 | 0.3 | 0.15 |
|  | 6.16 | .247 | .222 | 457.9 | 0.4 | .21 |
|  | 6.20 | .253 | .222 | 458.6 | 0.5 | .26 |
|  | 6.24 | .259 | .222 | 459.3 | 0.6 | .32 |
|  | 6.28 | .265 | .222 | 460.0 | 0.7 | .39 |
|  | 6.32 | .272 | .222 | 460.7 | 0.8 | .452 |
|  | 6.36 | .278 | .222 | 461.4 | 0.9 | .520 |
|  | 6.41 | .284 | .222 | 462.1 | 1.0 | .592 |
| 8% | 8.05 | .228 | .222 | 487.7 | 0.1 | .108 |
|  | 8.10 | .234 | .222 | 488.5 | 0.2 | .222 |
|  | 8.16 | .241 | .222 | 489.3 | 0.3 | .342 |
|  | 8.21 | .247 | .222 | 490.1 | 0.4 | .468 |
|  | 8.26 | .253 | .222 | 490.8 | 0.5 | .600 |
|  | 8.32 | .259 | .222 | 491.6 | 0.6 | .740 |

-continued

| $\left[100\frac{N_{Te}}{N_{Hg}}\right]$ Te$_i$ | $\left[100\left(\frac{N_{Te}}{N_{Hg}-S}\right)\right]$ Te$_f$ | $x_i$ | $x_f$ | T | S$_{(mol)}$ | Cd grown milli-mole |
|---|---|---|---|---|---|---|
| | 8.37 | .265 | .222 | 492.4 | 0.7 | .827 |
| | 8.43 | .272 | .222 | 493.2 | 0.8 | 1.04 |
| | 8.49 | .278 | .222 | 494.1 | 0.9 | 1.21 |
| | 8.54 | .284 | .222 | 494.9 | 1.0 | 1.38 |
| 10% | 10.06 | .228 | .222 | 515.8 | 0.1 | .222 |
| | 10.13 | .234 | .222 | 516.7 | 0.2 | .459 |
| | 10.19 | .241 | .222 | 517.6 | 0.3 | .710 |
| | 10.26 | .247 | .222 | 518.5 | 0.4 | .976 |
| | 10.33 | .253 | .222 | 519.4 | 0.5 | 1.26 |
| | 10.40 | .259 | .222 | 520.3 | 0.6 | 1.56 |
| | 10.47 | .265 | .222 | 521.2 | 0.7 | 1.88 |
| | 10.54 | .272 | .222 | 522.2 | 0.8 | 2.22 |
| | 10.61 | .278 | .222 | 523.1 | 0.9 | 2.59 |
| | 10.68 | .284 | .222 | 524.0 | 1.0 | 2.97 |

In operation, a method is provided for growing HgCdTe isothermally, comprising the steps of heating a HgCdTe growth solution proximate to the lower end of a HgCdTe growth solution vessel to a temperature suitable for forming HgCdTe on a CdTe or CdZnTe substrate immersed in the growth solution. At this temperature a portion of the Hg vaporizes and rises from the growth solution. As the Hg transfers from the growth solution the concentration of Hg within the HgCdTe solution is altered, causing HgCdTe to form on the substrate while maintaining a constant temperature. This process continues as the Hg is depleted from the HgCdTe growth solution.

As the Hg vapor rises within the growth solution vessel it reaches the cooling zone of the growth solution vessel and is cooled by a water-cooling jacket. The cooled Hg vapor condenses on the inner wall of the growth solution vessel wall proximate the cooling zone forming condensate which in conventional LPE HgCdTe growth is influenced by gravity to stream back to the bottom of the growth solution vessel to rejoin the growth solution. In the isothermal growth technique, the condensate Hg is captured by the channel and directed into the reservoir. When the reservoir is full, the condensate Hg overflows the reservoir and continues its progress towards the bottom of the growth solution vessel and rejoins the growth solution.

The reservoir is carefully calibrated for the temperature and the concentration of HgCdTe to capture precisely the amount of Hg condensation required to form the precise layer of HgCdTe required at the desired temperature. Once the reservoir is filled, the excess condensate Hg flows into the growth solution and causes HgCdTe growth to cease.

The volume of the reservoir may be altered by replacing the reservoir casing with a reservoir casing having a different volume. The reservoir casing having a different volume may capture more or less Hg, as desired, in order to change the amount of HgCdTe formed on the CdTe substrate. In an alternate embodiment, the reservoir casing may be fixedly secured on the growth vessel wall such that it may not be replaced. In this alternate embodiment the volume of the reservoir may be varied by adding or removing an inert "filler volume" as needed.

Accordingly, it will be appreciated that the method of growing improved HgCdTe of the present invention involves only conventional manufacturing techniques by adding a channel and a calibrated, replaceable Hg reservoir. The replaceable reservoir permits isothermal growth of HgCdTe. This approach permits easily repeatable and tightly controlled formation of HgCdTe having exacting characteristics as specified according to the growth solution, temperature and size of reservoir chosen as compared to the conventional HgCdTe growing process. The repeatability of the isothermal growth process is especially appreciated by noting that the growth end-point is steady-state compared to the dynamic situation in conventional growth by cooling the growth solution.

Figure 12:
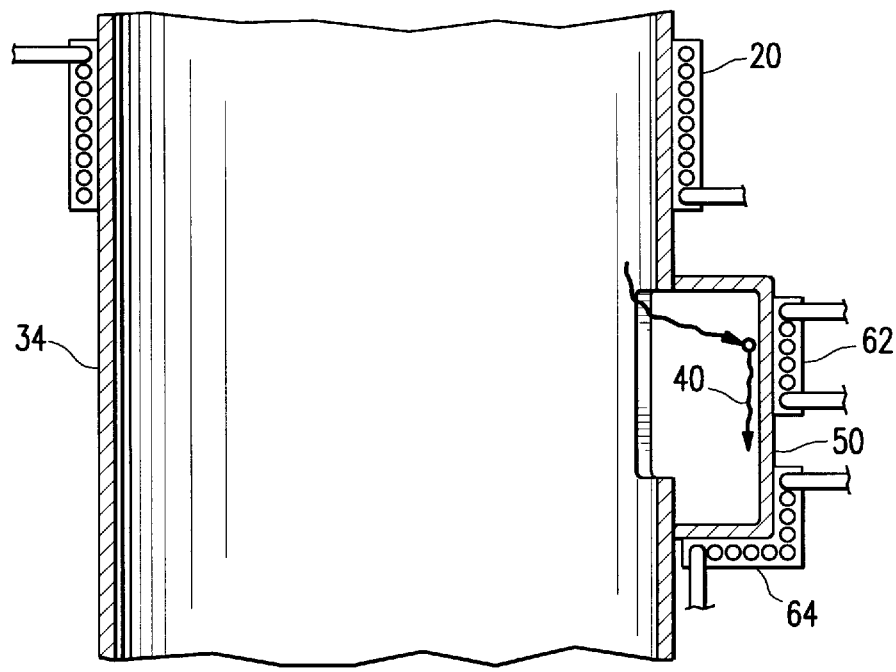
FIG. 12 is a side cross-sectional view of the growth solution vessel of an improved crystal growing system in accordance with a second embodiment of the present invention.

As shown in FIG. 12, an alternate embodiment of the crystal growing system of the present invention includes a Hg reservoir 50 having a carefully controlled volume. Instead of providing a channel 30 (as shown in FIG. 3) to channel condensate Hg 40 into the reservoir 50, the reservoir is provided with a cooling element 62 to cause condensate Hg 40 to form directly on a wall of the reservoir 50. The cooling element 62 may be provided as a cooling coil or other available cooling system such as a water-cooling jacket and may be controlled by the same control microprocessor 17 as shown in FIG. 2. The cooling element 62 is secured to a wall of the reservoir 50 proximate a top portion of the reservoir 50. A thermally conductive interface is provided between the wall of the reservoir 50 and the cooling element 62 such that when the cooling element 62 is activated the temperature of a portion of the wall of the reservoir 50 is lowered such that condensate Hg 40 may form. Once the reservoir is filled, the condensate Hg 40 overflows the reservoir and flows to the bottom of the growth solution vessel until it rejoins the growth solution, thus stopping the formation of the HgCdTe layer.

In this same embodiment heating element 64 may be provided in order to reset the growth solution once the desired crystal growth has been achieved. The heating element 64 may be provided as a conventional heating coil which may be controlled by the same control microprocessor 17 as shown in FIG. 2. The heating element 64 is secured to the reservoir wall 50 proximate the base of the reservoir such that upon activation the heat provided by the heating element 64 may be thermally conducted into the base of the reservoir to heat the condensate Hg 40 formed therein. Enough heat is provided by the heating element to cause the condensate Hg to gradually vaporize. Upon activation of the water-cooling jacket 20, Hg condensate 40 forms and flows to the bottom of the growth solution vessel to rejoin the growth solution.

Figure 13:
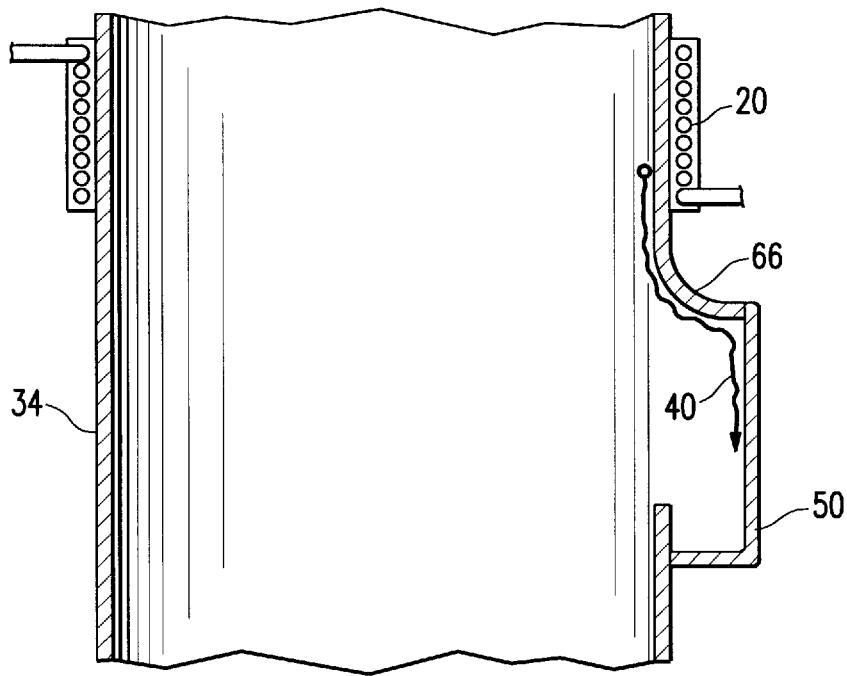
FIG. 13 is a side cross-sectional view of the growth solution vessel of an improved crystal growing system in accordance with a third embodiment of the present invention.

As shown in FIG. 13, an alternate embodiment of the crystal growing system of the present invention includes a Hg reservoir 50 having a carefully controlled volume and a gradually sloping top surface 66 where the reservoir joins the growth solution vessel wall 34. A water-cooling jacket 20 is provided which causes significant condensation of Hg in the upper cool zone of the growth solution vessel. This condensate Hg 40 runs down the growth solution vessel wall and back into the growth solution. The gradually sloping top surface 66 of the reservoir 50 directs a portion of the condensate Hg 40 towards the reservoir 50, where it is retained.

Figure 14:
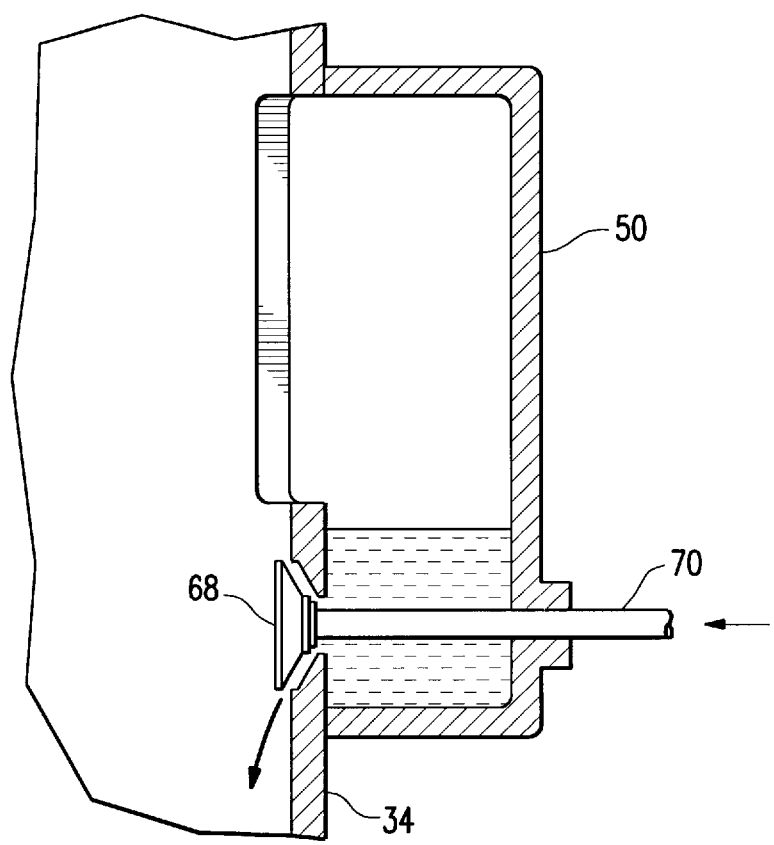
FIG. 14 is a side cross-sectional view of the growth solution vessel of an improved crystal growing system in accordance with a fourth embodiment of the present invention.

At the conclusion of operations, it may be desirable to empty the contents of the reservoir back into the growth solution vessel in anticipation of the next growth run while limiting the opportunity for outside contaminants to enter the growth solution. As shown in FIG. 14, an alternate embodiment of the crystal growing system of the present invention provides a valve system to permit condensate Hg 40 captured in the reservoir 50 to return to the bottom of the growth solution vessel. The valve system includes a valve 68 which is seated in the growth solution vessel wall between the reservoir and the interior of the growth solution vessel. The valve has a reset actuator 70 which may be operated manually or automatically, based on the operating conditions within the growth solution vessel 10. Upon actuation, the valve may be used to reset the growth solution or empty the reservoir 50 in preparation for additional operations.

Figure 15:
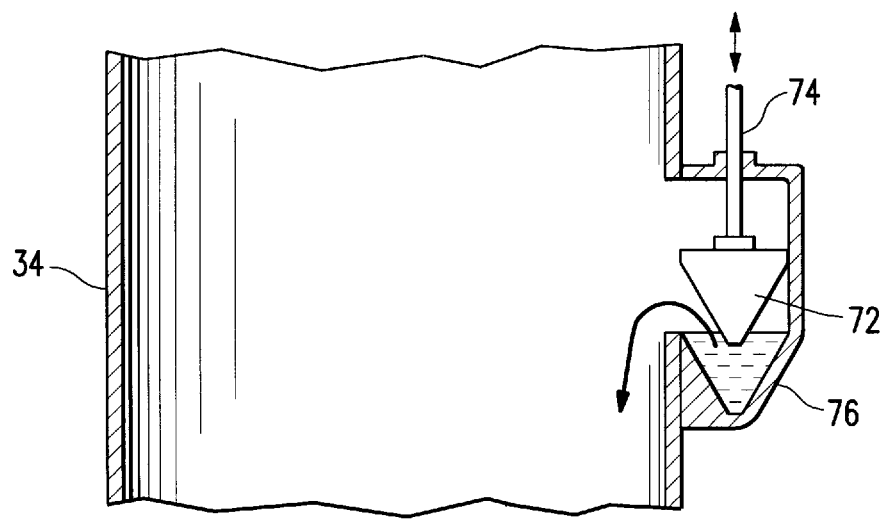
FIG. 15 is a side cross-sectional view of the growth solution vessel of an improved crystal growing system in accordance with a fifth embodiment of the present invention.

As discussed above, the reservoir 50 is carefully calibrated for the temperature and the concentration of HgCdTe to capture precisely the amount of Hg condensation required to form the precise layer of HgCdTe required at the desired temperature. As shown in FIG. 15, an alternate embodiment of the crystal growing system of the present invention provides a reservoir tuning system to permit finite calibration and adjustment of the volume of the reservoir 50. The tuning system includes a tuning head 72 and a tuning actuator 74. By moving the tuning actuator 74 to drive the tuning head into the reservoir 50, the volume of the reservoir 50 is reduced by the portion of the volume of the tuning head below the lip of the reservoir 50.

The tuning head may preferably be formed of an inert material, e.g., quartz, and provided with a shape corresponding to the shape of the base of the reservoir 50. For example, as shown in FIG. 15, if the base of the reservoir 50 is wedge-shaped, the tuning head 72 may be wedge-shaped. Matching the shape between the tuning head 72 and the base of the reservoir 50 permits the tuning head to not only serve as a tuner, wherein minor adjustments of volume may be made to the volume of the reservoir, but permits the tuning head to substantially empty the reservoir 50, if desired, by driving the tuning head toward the base of the reservoir until it substantially contacts the base of the reservoir 50. This tuning system may be used to modify the volume of the reservoir, reset the growth solution, or empty the reservoir 50 in preparation for additional operations.

The crystal growth vessel of the present invention and method for making HgCdTe on a substrate provides improved material uniformity due to forming HgCdTe at a single temperature. Isothermal growth of HgCdTe is more controllable because it is operator independent—dependent only upon temperature, the ratio of Hg, Cd and Te in the growth solution, and the size of the Hg reservoir. Each of these elements may be carefully measured and controlled. This results in improved wavelength control and improved compositional uniformity in the HgCdTe detector layer formed over the substrate. Furthermore, the present invention provides improved growth efficiency because there are fewer surfaces competing for the formation of HgCdTe crystals during the growing process. Furthermore, the method of the present invention employs preexisting well-known fabrication techniques and does not require any complex processing steps to be introduced into the manufacturing process. In fact, by eliminating the need to carefully reduce the temperature of the growth solution during the HgCdTe growing process, manufacturing is simplified.

While the foregoing description of the preferred embodiments have been described for presently preferred materials and geometries, it will be readily appreciated by those skilled in the art that the present invention is equally compatible with a variety of different sizes of Hg reservoirs and channel configurations. Furthermore, the process of fabricating the HgCdTe of the present invention may be also varied to take advantage of various processing techniques well known to those skilled in the art. Accordingly, the present invention should not be limited to the preferred embodiments described above. The invention is further defined by the following claims.

What is claimed is:

1. A method for growing HgCdTe isothermally in a closed system containing a HgCdTe growth solution, comprising the steps of:

heating a HgCdTe growth solution to a predetermined temperature during which Hg vapor is formed;

inserting a substrate into the HgCdTe growth solution;

maintaining a substantially constant temperature for the HgCdTe growth solution;

cooling the Hg vapor to form condensate Hg;

capturing the condensate Hg such that the captured amount of condensate Hg is not permitted to return to the HgCdTe growth solution, thereby initiating HgCdTe crystal growth on the substrate at the substantially constant temperature; and maintaining the heating, condensing and capturing steps until an amount of condensate Hg is captured which causes HgCdTe crystal growth to cease.

2. The method for growing HgCdTe isothermally as in claim 1, further comprising the step of providing a reservoir for capturing the Hg condensate and calibrating the reservoir to form a layer of HgCdTe which is predetermined according to the volume of the reservoir.

3. The method for growing HgCdTe isothermally as in claim 1, wherein the HgCdTe crystal growing temperature is in the range 300° C. to 550° C.

4. The method for growing HgCdTe isothermally as in claim 1, wherein the substrate is formed of material selected from the group consisting of CdTe, CdZnTe, CdTe on Si, CdZnTe on Si, CdTe on Sapphire, and CdZnTe on Sapphire.

5. The method for growing HgCdTe isothermally as in claim 1, further comprising the step of removing the substrate and HgCdTe grown thereon from the closed system through a resealable means.

* * * * *